US008817519B2

(12) United States Patent
Jeong et al.

(10) Patent No.: US 8,817,519 B2
(45) Date of Patent: Aug. 26, 2014

(54) INTEGRATED CIRCUIT INCLUDING E-FUSE ARRAY CIRCUIT

(71) Applicant: SK hynix Inc., Gyeonggi-do (KR)

(72) Inventors: Jeongsu Jeong, San Jose, CA (US);
Youncheul Kim, San Jose, CA (US);
Hyunsu Yoon, Gyeonggi-do (KR);
Yonggu Kang, Gyeonggi-do (KR);
Igsoo Kwon, San Jose, CA (US);
Yeonuk Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 100 days.

(21) Appl. No.: 13/672,408

(22) Filed: Nov. 8, 2012

(65) Prior Publication Data

US 2014/0126318 A1     May 8, 2014

(51) Int. Cl.
*G11C 17/12* (2006.01)
*G11C 17/16* (2006.01)
*G11C 8/08* (2006.01)
*G11C 5/14* (2006.01)

(52) U.S. Cl.
CPC ..... *G11C 17/16* (2013.01); *G11C 8/08* (2013.01); *G11C 5/148* (2013.01)
USPC ................. 365/96; 365/189.09; 365/189.11; 365/229

(58) Field of Classification Search
CPC ........... G11C 17/16; G11C 8/08; G11C 5/148
USPC .................... 365/96, 189.09, 189.11, 229
See application file for complete search history.

(56) References Cited

U.S. PATENT DOCUMENTS

| 6,777,757 B2 * | 8/2004 | Peng et al. ................ 257/368 |
| 7,173,851 B1 * | 2/2007 | Callahan et al. ......... 365/185.05 |
| 7,269,047 B1 * | 9/2007 | Fong et al. ................ 365/104 |
| 2005/0117406 A1 * | 6/2005 | Atsumi et al. ........... 365/189.05 |

* cited by examiner

*Primary Examiner* — Hoai V Ho
(74) *Attorney, Agent, or Firm* — IP & T Group LLP

(57) ABSTRACT

An integrated circuit includes a high voltage generator generating a high voltage, a negative voltage generator generating a negative voltage, a divided voltage generator generating a divided voltage by dividing the power source voltage and supplying it to a read voltage terminal, a first power gate supplying the high voltage or the divided voltage to a program voltage terminal, a second power gate supplying the negative voltage or the ground voltage to a deactivation voltage terminal, a third power gate supplying the ground voltage or the divided voltage to an activation voltage terminal, and an e-fuse array circuit operating using voltage of the program voltage terminal as a program voltage, voltage of the divided voltage terminal as a read voltage, voltage of the activation voltage terminal as an activation voltage, and voltage of the deactivation voltage terminal as a deactivation voltage.

12 Claims, 7 Drawing Sheets

INTEGRATED CIRCUIT INCLUDING E-FUSE ARRAY CIRCUIT

BACKGROUND

1. Field

Exemplary embodiments of the present invention relate to an e-fuse array circuit.

2. Description of the Related Art

A common fuse may be programmed in a wafer state because the data of the fuse is determined based on whether the fuse is cut by a laser or not. However, it is difficult to program the fuse after the wafer is mounted on a package. An e-fuse is used to overcome the disadvantage. The e-fuse stores data by changing resistance between a gate and a source using a transistor.

FIG. 1 is a diagram illustrating an e-fuse including a transistor. The e-fuse may operate as a resistor or a capacitor.

Referring to FIG. 1, the e-fuse includes a transistor T. A power source voltage is supplied to the gate G of the transistor T, and a ground voltage is supplied to the drain/source D/S thereof.

If a common power source voltage that the transistor may tolerate is supplied to the gate, the e-fuse operates as a capacitor C. Accordingly, there is no electric current that flows between the gate G and the drain/source D/S. If a high power source voltage that the transistor may not tolerate is supplied to the gate G, the gate oxide of the transistor T is ruptured, and the gate G and the drain/source D/S are shorted, so that the e-fuse operates as a resistor. Accordingly, an electric current flows between the gate G and the drain/source D/S. The data of the e-fuse is determined based on a resistance value between the gate G and the drain/source D/S of the e-fuse using this phenomenon. Here, the data of the e-fuse may be immediately determined without an additional sensing operation by (1) increasing the size of the transistor T or (2) sensing an electric current flowing through the transistor T by using an amplifier without increasing the size of the transistor T. The two methods may not be effectively used, because the size of the transistor T that forms the e-fuse must be increased, or the amplifier for amplifying data must be included in each e-fuse.

SUMMARY

Exemplary embodiments of the present invention are directed to minimize an area occupied by an e-fuse circuit by forming e-fuses in an array form.

Other embodiments of the present invention are directed to improve the current consumption efficiency of a circuit for generating voltages that are used to operate an e-fuse circuit by optimizing the level of voltages used by the e-fuse circuit.

Other embodiments of the present invention are directed to minimize the amount of current consumed by an e-fuse circuit by controlling the voltage levels supplied to the e-fuse circuit in sections, where the e-fuse circuit does not operate.

In accordance with an embodiment of the present invention, an integrated circuit includes a high voltage generator configured to generate a high voltage by pumping a power source voltage, a negative voltage generator configured to generate a negative voltage by pumping a ground voltage, a divided voltage generator configured to generate a divided voltage by dividing the power source voltage and supply the divided voltage to a read voltage terminal, a first power gate configured to supply either the high voltage or the divided voltage to a program voltage terminal in response to an idle signal, a second power gate configured to supply either the negative voltage or the ground voltage to a deactivation voltage terminal in response to the idle signal, a third power gate configured to supply either the ground voltage or the divided voltage to an activation voltage terminal in response to the idle signal, and an e-fuse array circuit configured to operate using voltage supplied to the program voltage terminal as a program voltage, using voltage supplied to the divided voltage terminal as a read voltage, using voltage supplied to the activation voltage terminal as an activation voltage, and using voltage supplied to the deactivation voltage terminal as a deactivation voltage.

In accordance with another embodiment of the present invention, an integrated circuit includes a controller configured to generate a row address, a column address, a read command, a program command, and an idle signal, a high voltage generator configured to generate a high voltage by pumping a power source voltage, a negative voltage generator configured to generate a negative voltage by pumping a ground voltage, a divided voltage generator configured to generate a divided voltage by dividing the power source voltage and supply the divided voltage to a read voltage terminal, a first power gate configured to supply either the high voltage or the divided voltage to a program voltage terminal in response to an idle signal, a second power gate configured to supply either the negative voltage or the ground voltage to a deactivation voltage terminal in response to the idle signal, a third power gate configured to supply either the ground voltage or the divided voltage to an activation voltage terminal in response to the idle signal, and an e-fuse array circuit configured to program an e-fuse device, which is selected in response to the row address and the column address, using voltage supplied to the program voltage terminal as a program voltage in response to the program command, to read data from an e-fuse device, which is selected in response to the row address and the column address, using voltage supplied to the read voltage terminal as a read voltage in response to the read command, to use voltage supplied to the activation voltage terminal as an activation voltage, and to use voltage supplied to the deactivation voltage terminal as a deactivation voltage.

DETAILED DESCRIPTION

Figure 1:
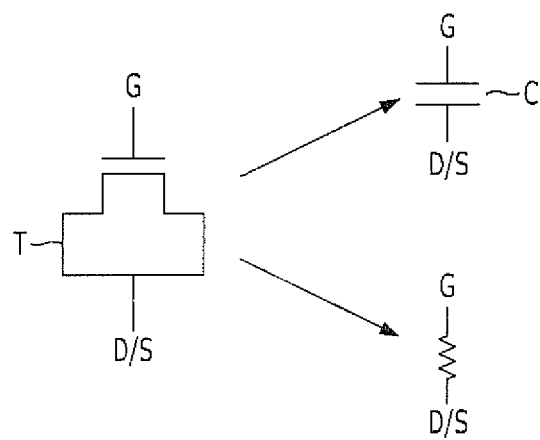
FIG. 1 is a diagram illustrating an e-fuse including a transistor and that the e-fuse operates as a resistor or a capacitor.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
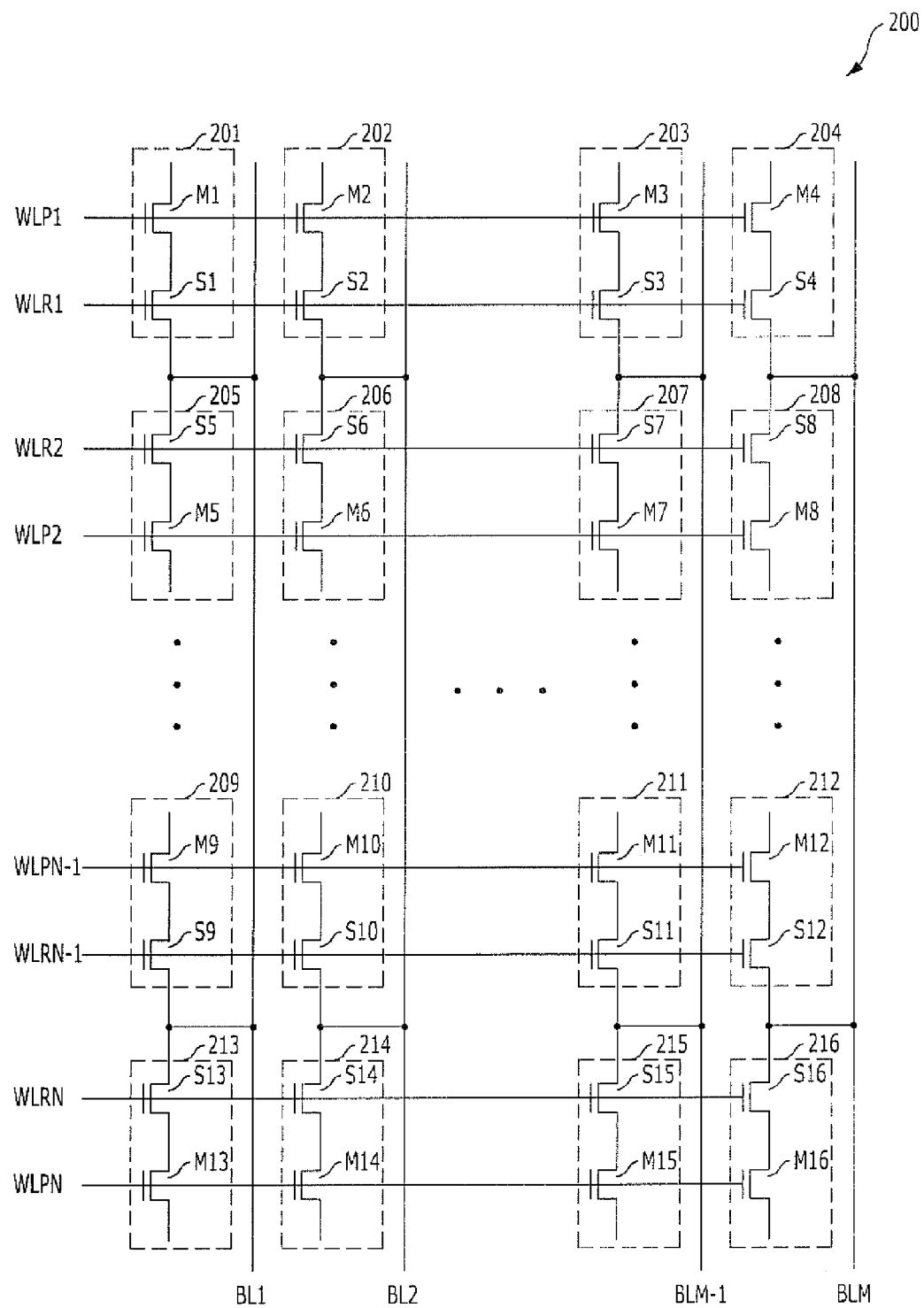
FIG. 2 is a circuit diagram of a cell array 200 including an e-fuse in accordance with one embodiment of the present invention.

FIG. 2 is a circuit diagram of a cell array 200 including an e-fuse in accordance with one embodiment of the present invention.

Referring to FIG. 2, the cell array 200 includes memory cells 201 to 216 arranged in N rows and M columns. The memory cells 201 to 216 include respective memory devices M1 to M16 and switch devices S1 to S16. Each of the memory devices M1 to M16 is an e-fuse that has the properties of a resistor or capacitor depending on whether the e-fuse is ruptured or not. That is, each of the e-fuses M1 to M16 may be considered as a resistive memory device for storing data based on the amount of resistance. The switch devices S1 to S16 electrically connect the memory devices M1 to M16 to column lines BL1 to BLM under the control of row lines WLR1 to WLRN.

Hereinafter, a second row will be referred to as a selected row, and an M$^{th}$ column will be referred to as a selected column. That is, the memory cell 208 is a selected memory cell. Voltages supplied to the selected memory cell 208 and the remaining unselected memory cells 201 to 207 and 209 to 216 when program and read operations are performed are described below.

Program Operation

The selected row line WLR2 is activated, and the remaining row lines WLR1 and WLR3 to WLRN are deactivated. Here, an activation voltage VACT capable of turning on the switch devices S5 to S8 has to be supplied to the activated row line WLR2, and a deactivation voltage VINACT capable of turning off the switch devices S1 to S4 and S9 to S16 has to be supplied to the deactivated row lines WLR1 and WLR3 to WLRN. Accordingly, the switch devices S5 to S8 are turned on, and the switch devices S1 to S4 and S9 to S16 are turned off. A program voltage VPGM, which may be high enough to rupture the gate oxide of the e-fuse, has to be supplied to a program/read line WLP2 corresponding to the selected row. In order to rupture the gate oxide of the e-fuse, a voltage difference between the gate and the drain/source of the e-fuse has to be maintained at about 6V. That is, the program voltage VPGM supplied to the gate of the selected e-fuse M8, which is to be programmed, and voltage supplied to the selected column line BLM corresponding to the e-fuse M8 have to maintain a potential difference of approximately 6V. The deactivation voltage VINACT is supplied to the unselected program/read lines WLP1 and WLP3 to WLPN. In order to program the e-fuse M8, the deactivation voltage VINACT from a column circuit, which will be described later, is supplied to the column line BLM. To prevent the unselected e-fuses M5 to M7 form being programmed, the unselected column lines BL1 to BLM-1 corresponding to the unselected e-fuses M5 to M7 are floated by the column circuit or are supplied with voltage (for example, the activation voltage VACT), which is higher than the deactivation voltage VINACT from the column circuit.

Read Operation

The selected row line WLR2 is activated, and the remaining row lines WLR1 and WLR3 to WLRN are deactivated. Here, the activation voltage VACT capable of turning on the switch devices S5 to S8 is supplied to the activated row line WLR2, and the deactivation voltage VINACT capable of turning off the switch devices S1 to S4 and S9 to S16 is supplied to the deactivated row lines WLR1 and WLR3 to WLRN. Accordingly, the switch devices S5 to S8 are turned on, and the switch devices S1 to S4 and S9 to S16 are turned off. A read voltage VRD (that is, voltage higher than the activation voltage VACT, but lower than the program voltage VPGM) suitable for the read operation is supplied to the program/read line WLP2 of the selected row. The deactivation voltage VINACT is supplied to the remaining program/read lines WLP1 and WLP3 to WLPN. The column circuit supplies the deactivation voltage VINACT to the selected column line BLM and determines whether an electric current flows from the program/read line WLP2 to the column line BLM or not through the e-fuse M8. The column circuit also determines whether the e-fuse M8 has been programmed or not (that is, data is '1' or '0') based on a result of the determination.

One (that is, the column line BLM) of the plurality of column lines BL1 to BLM has been referred as a selected column line, but a plurality of column lines may become selected column lines at the same time. In other words, a plurality of memory cells that belongs to one row may be programmed or read at the same time.

Figure 3:
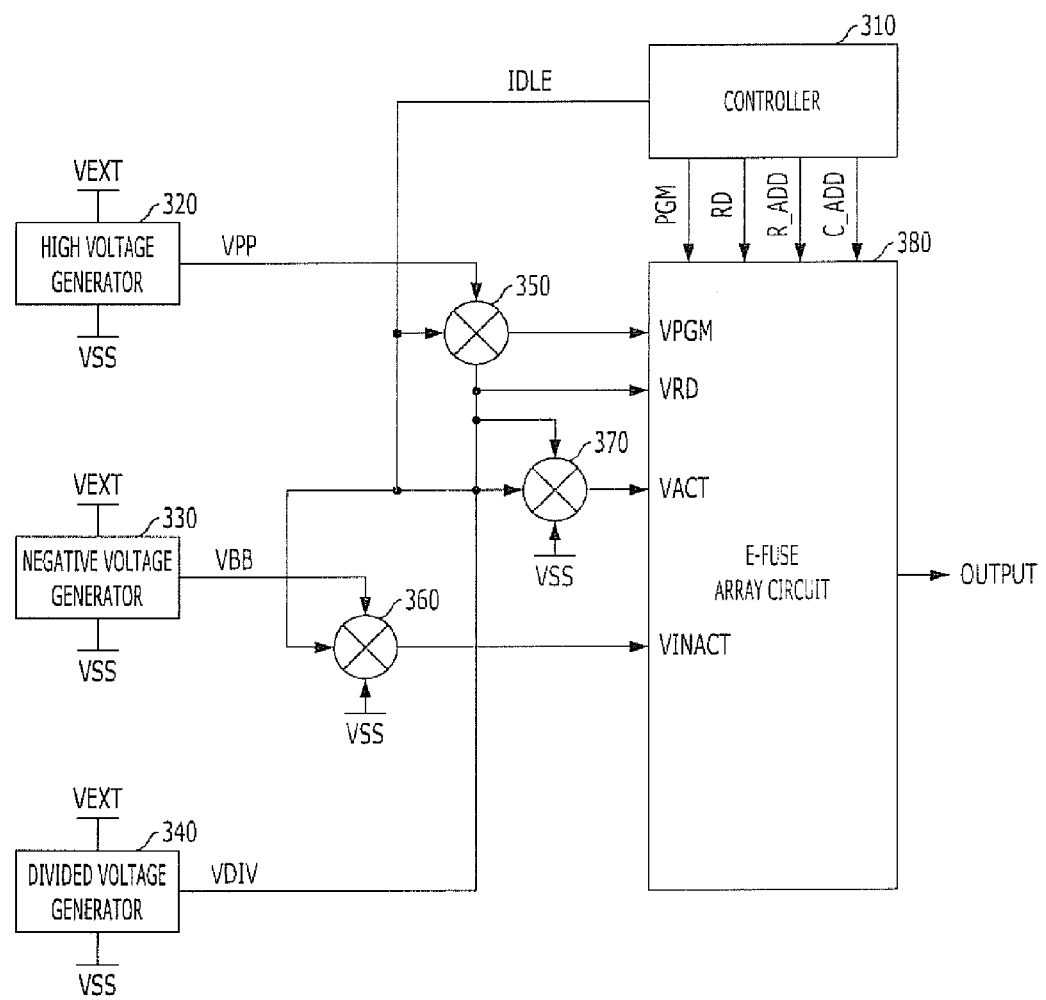
FIG. 3 is a circuit diagram of an integrated circuit including an e-fuse array circuit in accordance with one embodiment of the present invention.

FIG. 3 is a circuit diagram of an integrated circuit including an e-fuse array circuit in accordance with one embodiment of the present invention.

Referring to FIG. 3, the integrated circuit includes a controller 310, a high voltage generator 320, a negative voltage generator 330, a divided voltage generator 340, a first power gate 350, a second power gate 360, a third power gate 370, and an e-fuse array circuit 380.

The controller 310 generates a program command PGM for programming the e-fuse array circuit 380, a read command RD for reading data from the e-fuse array circuit 380, and a row address R_ADD and a column address C_ADD for designating a memory cell that will be programmed or read in the e-fuse array circuit 380. The controller 310 transfers the generated commands and addresses to the e-fuse array circuit 380. Furthermore, the controller 310 activates an idle signal IDLE in sections in which the e-fuse array circuit 380 does not need to operate. In other words, the controller 310 activates an idle signal IDLE in sections in which the e-fuse array circuit 380 does not need to perform program or read operation. The controller 310, together with the e-fuse array circuit 380, may be formed on the same chip (or wafer) or may be formed on different chips. In practice, the controller 310 is often formed on a separate chip from the e-fuse array circuit 380.

The high voltage generator 320 generates the high voltage VPP, having a higher voltage level than the power source voltage VEXT, by using the external power source voltage VEXT, which may be received from a source other than the e-fuse array circuit, and a ground voltage VSS. The power source voltage VEXT may have a voltage level of about 1 to 2V (hereinafter illustrated as being 1.2V), and the high voltage VPP can have a level of about 15 to 4.5V (hereinafter illustrated as being 4V).

The negative voltage generator 330 generates a negative voltage VBB, which has a lower voltage level than the ground voltage VSS, by using the power source voltage VEXT, which may be received from a source other than the integrated circuit, and the ground voltage VSS. The negative voltage VBB may have a level of about −1.5 to −2.5V (hereinafter illustrated as being −2V).

The divided voltage generator 340 generates a divided voltage VDIV through voltage division by using the power source voltage VEXT, which may be received from a source other than the integrated circuit, and the ground voltage VSS. The divided voltage VDIV can have a level of about VEXT× 0.7 to VEXT×0.9 (hereinafter illustrated as being 1.0V). The divided voltage VDIV generated from the divided voltage generator 340 is supplied to the read voltage terminal VRD of the e-fuse array circuit 380.

The first power gate 350 supplies either the high voltage VPP or the divided voltage VDIV to the program voltage terminal VPGM of the e-fuse array circuit 380 in response to the idle signal IDLE. When the idle signal IDLE is deactivated, the first power gate 350 supplies the high voltage VPP to the program voltage terminal VPGM. When the idle signal IDLE is activated, the first power gate 350 supplies the divided voltage VDIV to the program voltage terminal VPGM.

The second power gate 360 supplies either the negative voltage VBB or the ground voltage VSS to the deactivation voltage terminal VINACT of the e-fuse array circuit 380 in response to the idle signal IDLE. When the idle signal IDLE is deactivated, the second power gate 360 supplies the negative voltage VBB to the deactivation voltage terminal VINACT. When the idle signal IDLE is activated, the second power gate 360 supplies the ground voltage VSS to the deactivation voltage terminal VINACT.

The third power gate 370 supplies either the ground voltage VSS or the divided voltage VDIV to the activation voltage terminal VACT of the e-fuse array circuit 380 in response to the idle signal IDLE. When the idle signal IDLE is deactivated, the third power gate 370 supplies the ground voltage VSS to the activation voltage terminal VACT. When the idle signal IDLE is activated, the third power gate 370 supplies the divided voltage VDIV of the activation voltage terminal VACT.

When the program command PGM from the controller 310 is activated and received, the e-fuse array circuit 380 programs (ruptures) a memory cell selected in response to the row address R_ADD and the column address C_ADD. Furthermore, when the read command RD from the controller 310 is activated and received, the e-fuse array circuit 380 reads data from a memory cell that is selected in response to the row address R_ADD and the column address C_ADD and outputs the read data through a data output terminal OUTPUT. The e-fuse array circuit 380 uses voltage, which is supplied to the program voltage terminal VPGM, as the program voltage for programming (rupturing) an e-fuse. Alternatively, the e-fuse array circuit 380 uses voltage, which is supplied to the read voltage terminal VRD, as the read voltage for reading data from an e-fuse. Furthermore, the e-fuse array circuit 380 uses voltage, which is supplied to the activation voltage terminal VACT, as the activation voltage that is used to turn on a variety of switches or used as a logic high in circuit blocks. Furthermore, the e-fuse array circuit 380 uses voltage, supplied to the deactivation voltage terminal VINACT, as the deactivation voltage that is used to turn on a variety of switches or used as a logic low in circuit blocks.

From among the elements of FIG. 3, the high voltage generator 320, the negative voltage generator 330, the divided voltage generator 340, the first to third power gates 350 to 370, and the e-fuse array circuit 380 preferably are formed on the same chip, and the controller 310 and the e-fuse array circuit 380 may be formed on the same chip or on different chips. In some other exemplary embodiments, all the elements of FIG. 3 may be formed on different chips.

Figure 4:
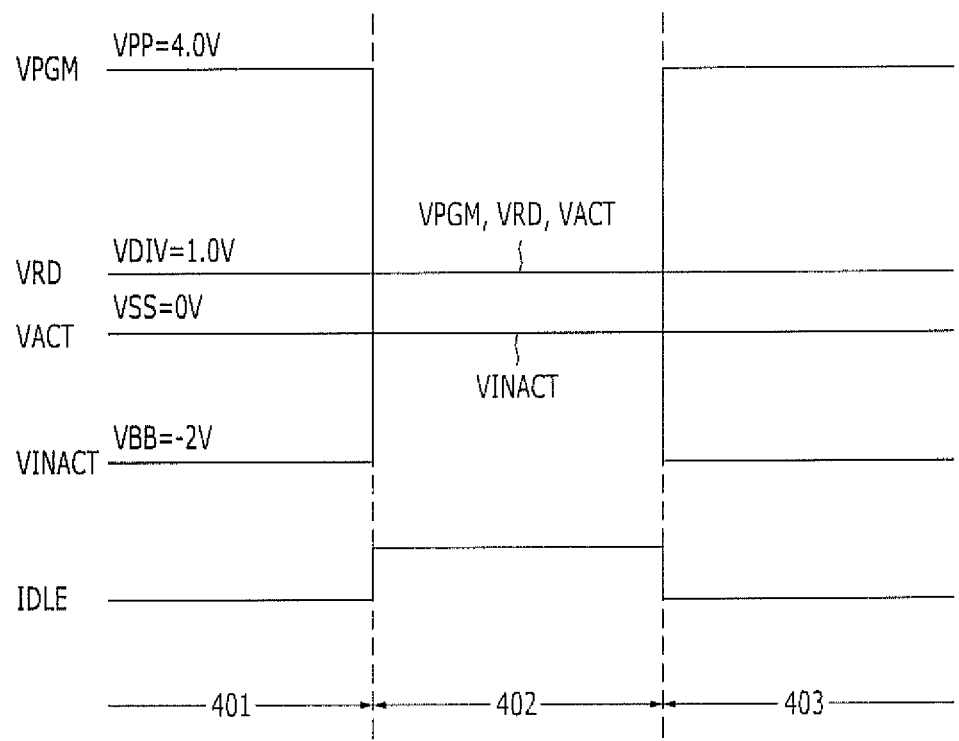
FIG. 4 is a diagram illustrating the levels of voltages supplied to the voltage terminals VPGM, VRD, VACT, and VINACT of the e-fuse array circuit 380 when an idle signal IDLE is activated or deactivated.

FIG. 4 is a diagram showing the voltage levels supplied to the voltage terminals VPGM, VRD, VACT, and VINACT of the e-fuse array circuit 380 when the idle signal IDLE is activated or deactivated.

Referring to FIG. 4, in sections 401 and 403 in which the idle signal IDLE is deactivated, the high voltage VPP of 4.0V is supplied to the program voltage terminal VPGM, the divided voltage VDIV of 1.0V is supplied to the read voltage terminal VRD, the ground voltage VSS of 0V is supplied to the activation voltage terminal VACT, and the negative voltage VBB of −2V is supplied to the deactivation voltage terminal VINACT. In sections in which the idle signal IDLE is deactivated, program and read operations may be performed by using supplied voltages because a difference between the high voltage VPP of 4V, that is, the highest voltage level, and the negative voltage VBB of −2V, that is, the lowest voltage level, both supplied from the e-fuse array circuit 380, is 6V.

In a section 402 in which the idle signal IDLE is activated, the divided voltage VDIV is supplied to the program voltage terminal VPGM, the divided voltage VDIV is supplied to the read voltage terminal VRD, the divided voltage VDIV is supplied to the activation voltage terminal VACT, and the ground voltage VSS is supplied to the deactivation voltage terminal VINACT. That is, in the section 402 in which the idle signal IDLE is activated, only voltages VDIV and VSS of the extent that only high and low levels may be distinguished from each other are supplied to the e-fuse array circuit 380. In the section 402, the amount of current consumed by the e-fuse array circuit 380 may be minimized because a difference between the divided voltage VDIV of 1.0V, that is, the highest level, and the ground voltage VSS of 0 V, that is, the lowest level, both supplied from the e-fuse array circuit 380, is only 1 V. If only the ground voltage VSS is supplied to all the voltage terminals of the e-fuse array circuit 380 in the section 402, the amount of current consumed by the e-fuse array circuit 380 may be further reduced. In this case, however, there is a problem in that a malfunction due to a latch-up phenomenon may occur, because it is difficult to distinguish the low and high voltage levels, supplied to the e-fuse array circuit 380, from each other.

Figure 5:
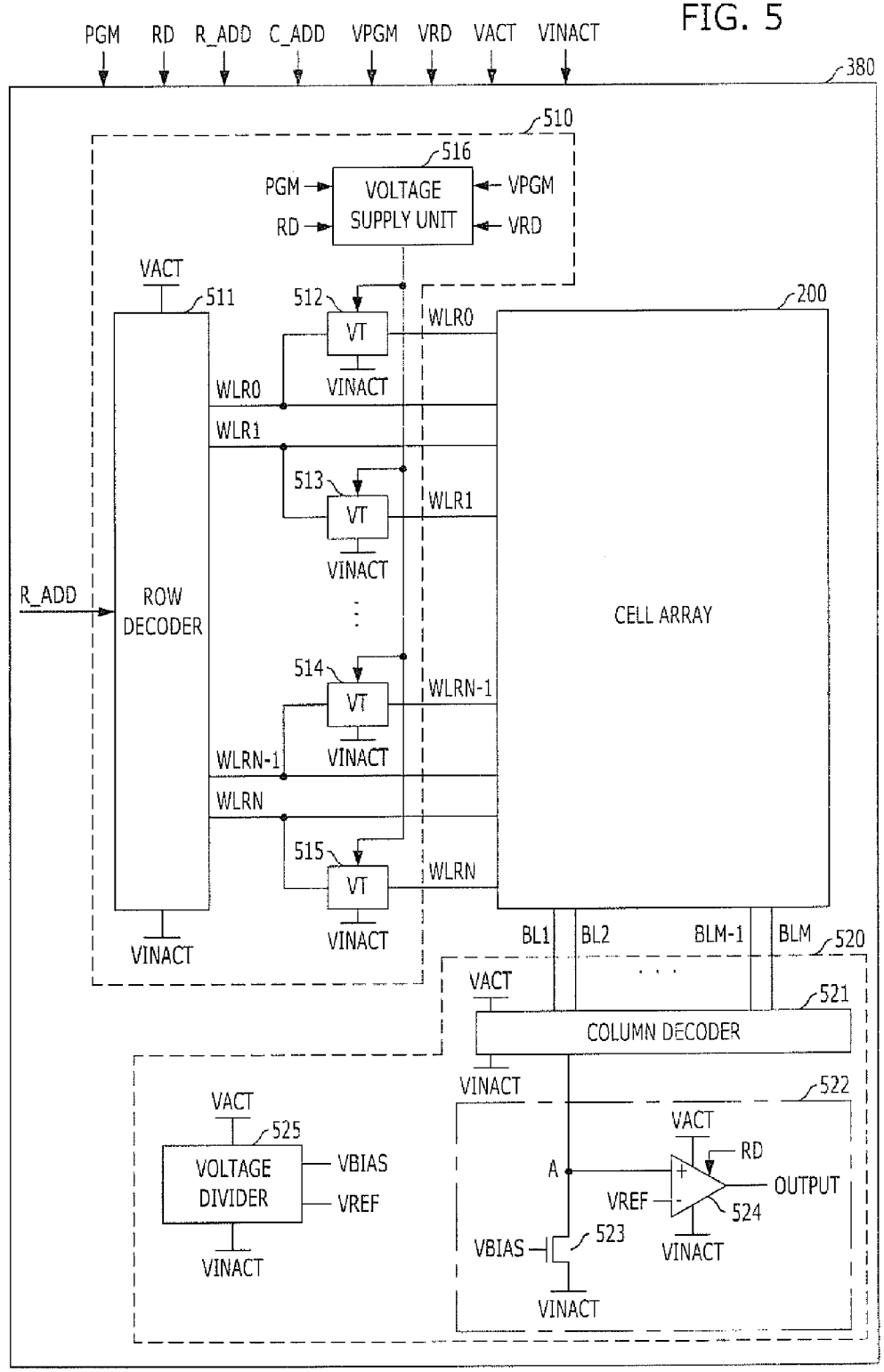
FIG. 5 is a circuit diagram in accordance with one embodiment of the e-fuse array circuit 380 of FIG. 3.

FIG. 5 is a circuit diagram in accordance with one embodiment of the e-fuse array circuit 380 of FIG. 3.

Referring to FIG. 5, the e-fuse array circuit 380 includes a cell array 200, a row circuit 510, and a column circuit 520.

The row circuit 510 supplies the row lines WLR1 to WLRN and the program/read lines WLP1 to WLPN with voltages, such as those described with reference to FIG. 2, when program and read operations are performed. The row circuit 510 includes a row decoder 511, a voltage supply unit 516, and voltage converters 512 to 515.

The row decoder 511 operates in response to the activation voltage VACT and the deactivation voltage VINACT and supplies the activation voltage VACT to a row line selected among the row lines WLR1 to WLRN in response to a row address R_ADD. The row decoder 511 supplies the deactivation voltage VINACT to the remaining unselected row lines.

Each of the voltage converters 512 to 515 supplies a negative voltage to each of the program/read lines WLP1 to WLPN if voltage of each of the row lines WLR1 to WLRN has the same voltage level as the deactivation voltage VINACT. Each of the voltage converters 512 to 515 supplies voltage received from the voltage supply unit 516 to each of the program/read lines WLP1 to WLPN if voltage of each of the row lines WLR1 to WLRN has the same voltage level as the activation voltage VACT. The voltage supply unit 516 supplies the program voltage VPGM to the voltage converters 512 to 515 when a program operation is performed, that is, when the program command PGM is activated. Furthermore, the voltage supply unit 516 supplies the read voltage VRD to the voltage converters 512 to 515 when a read operation is performed, that is, when the read command RD is activated.

The column circuit 520 supplies the column lines BL1 to BLM with voltages, such as those described with reference to FIG. 2, when program and read operations are performed. Furthermore, when a read operation is performed, the column circuit 520 detects current flowing through a selected column line and determines the data of the selected column line based on a result of the detection. The column circuit 520 includes a column decoder 521 and a sense amplifier 522.

The column decoder 521 electrically connects a column line selected among the column lines BL1 to BLM in response to a column address C_ADD with the sense amplifier 522 and floats or grounds the remaining column lines.

The sense amplifier 522 includes a current limiter 523 and a comparator 524. The current limiter 523 includes a transistor that is controlled by a bias voltage VBIAS (having a level close to the deactivation voltage VINACT+the threshold voltage of the transistor) and functions to supply the deactivation voltage VINACT to a selected column line. For reference, although the e-fuse of a selected memory cell is not programmed due to the defect of the gate oxide of the e-fuse, some current (for example, an electric current less than 1 μA) may flow. The bias voltage VBIAS is controlled so that a difference between an unwanted small amount of current caused by the defect of a selected e-fuse and a large amount of current (for example, an electric current equal to or higher than 10 μA) for programming the selected e-fuse may be determined, and thus, a sufficient amount of current may flow from a selected column.

The comparator 524 is activated when a read operation is performed, that is, when the read command RD is activated, and configured to compare a reference voltage VREF with the voltage of a node A placed over the current limiter 523 and to sense data based on a result of the comparison. If a memory cell selected by the row decoder 511 and the column decoder 521 is programmed (ruptured), voltage of the node A does not maintain the level of the deactivation voltage VINACT, but the voltage at node A becomes higher than the reference voltage VREF because an electric current flows through the node A. As a result, the comparator 524 generates the output data OUTPUT of a 'high' level. If a memory cell selected by the row decoder 511 and the column decoder 521 is not programmed, an electric current does not flow through the node A (or only very small amount of current flows), and thus, voltage of the node A maintains the level of the deactivation voltage VINACT. Accordingly, the comparator 524 generates the output data OUTPUT of a 'low' level. An example has been described above for an embodiment when a read operation is performed. In that embodiment, the deactivation voltage VINACT is supplied to the node A by the current limiter 523, and voltage of the node A maintains or does not maintain the voltage level of the deactivation voltage VINACT depending on whether there is an electric current flowing from a selected memory cell to the node A or not. In some embodiments, however, a precharge circuit for precharging the node A to the level of the deactivation voltage VINACT before a read operation is performed may be further added.

Each of the bias voltage VBIAS and the reference voltage VREF used in the column circuit 520 has a voltage level between the activation voltage VACT and the deactivation voltage VINACT. Accordingly, the bias voltage VBIAS and the reference voltage VREF may be generated by a voltage divider 525 that is operated by the activation voltage VACT and the deactivation voltage VINACT.

Figure 6:
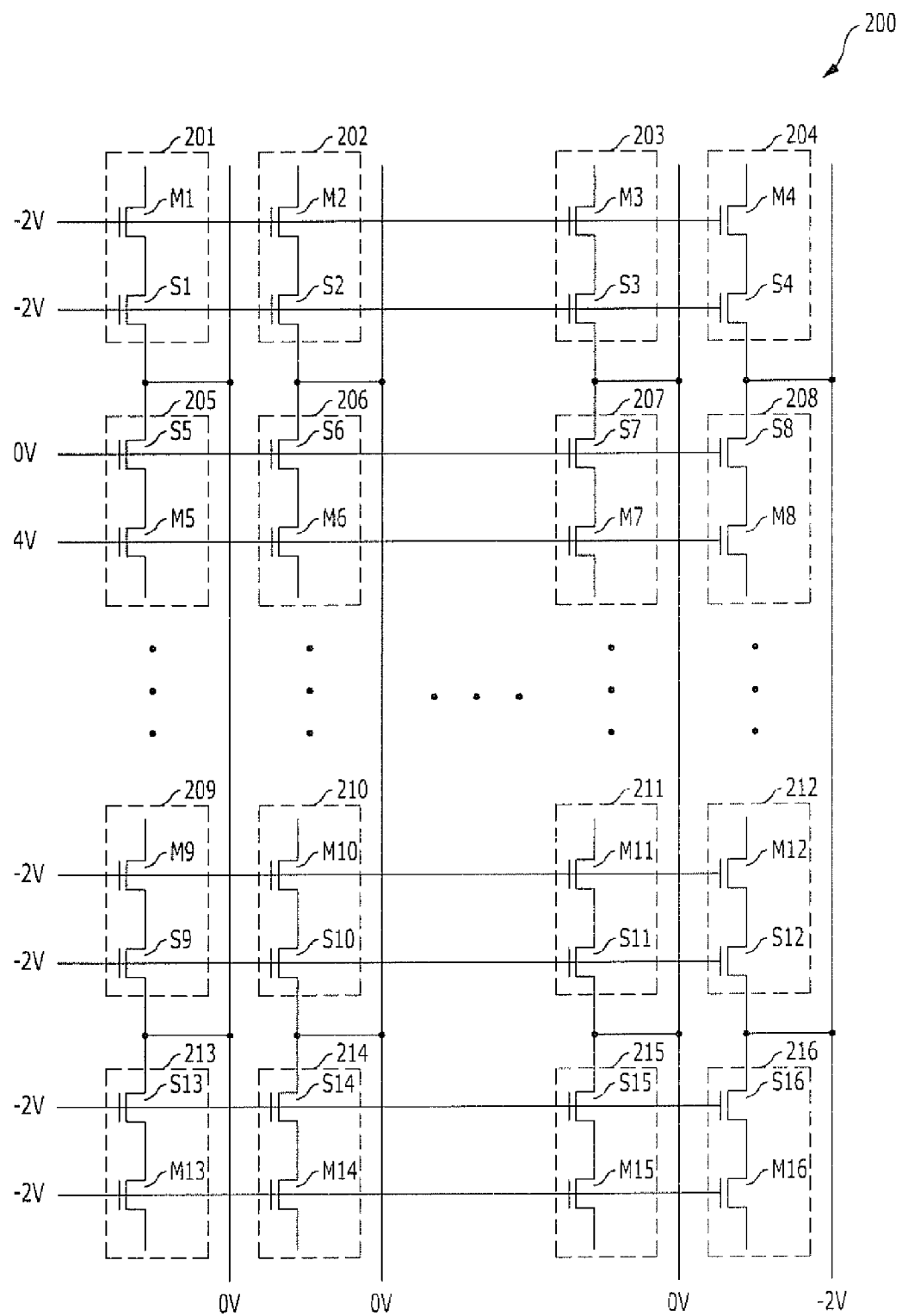
FIG. 6 is a circuit diagram illustrating the voltage levels supplied to row-series lines WLR1 to WLRN and WLP1 to WLPN and column lines BL1 to BLM when a program operation is performed.
Figure 7:
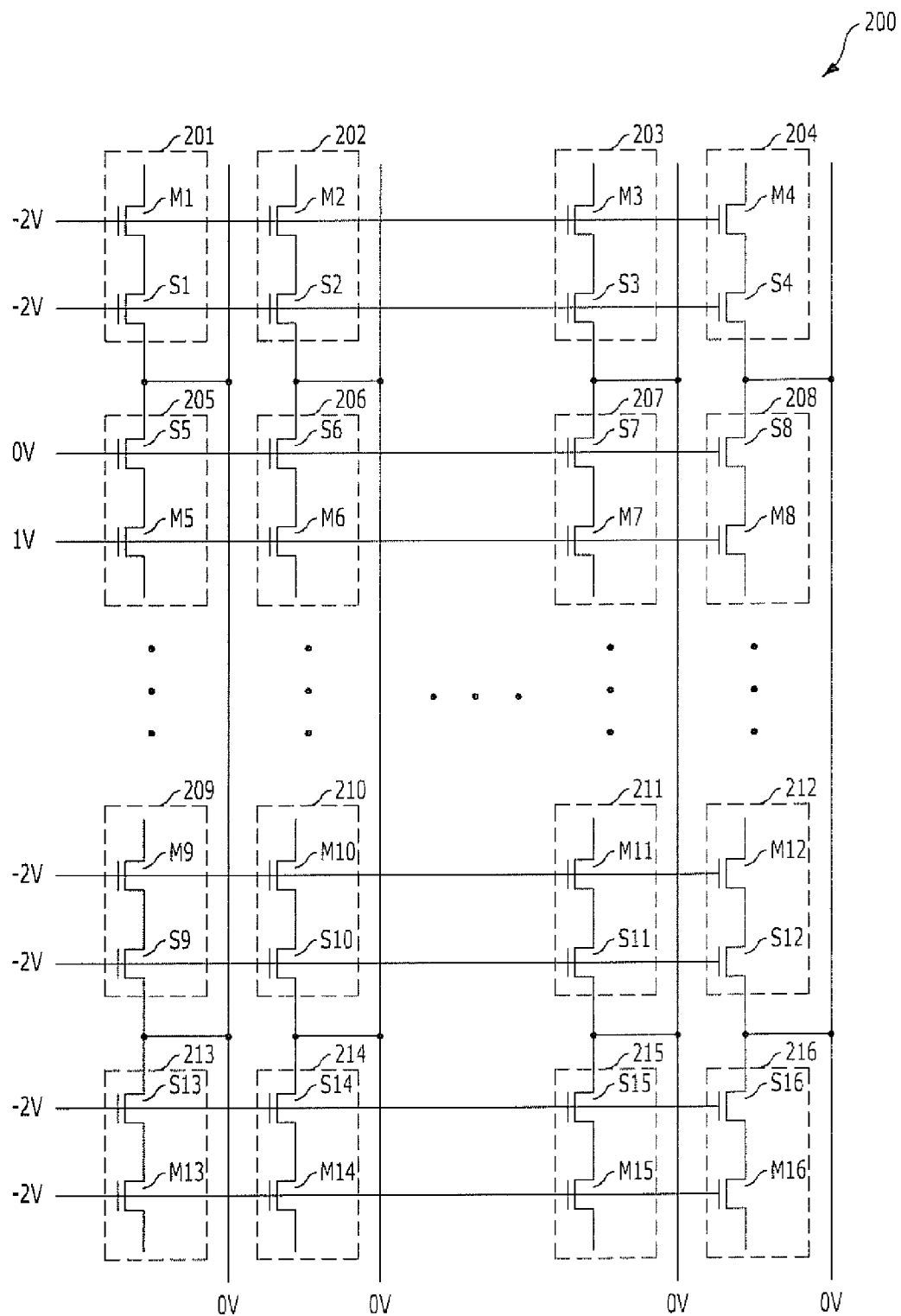
FIG. 7 is a circuit diagram illustrating the voltage levels supplied to the row-series lines WLR1 to WLRN and WLP1 to WLPN and column lines BL1 to BLM when a read operation is performed.

FIGS. 6 and 7 are diagrams showing the voltage levels supplied to the row-series lines WLR1 to WLRN and WLP1 to WLPN and the column lines BL1 to BLM when a selected row is a second row and a selected column is an $M^{th}$ column in the cell array 200 of the e-fuse array circuit 380. FIG. 6 is a circuit diagram illustrating the voltage levels supplied to row-series lines WLR1 to WLRN and WLP1 to WLPN and column lines BL1 to BLM when a program operation is performed, and FIG. 7 is a circuit diagram illustrating the voltage levels supplied to the row-series lines WLR1 to WLRN and WLP1 to WLPN and column lines BL1 to BLM when a read operation is performed. From FIGS. 6 and 7, it can be clearly understood how the row circuit 510 and the column circuit 520 of FIG. 5 operate when the program and read operations are performed.

In accordance with the present invention, there may be an advantage in that the amount of current consumed by an e-fuse circuit may be minimized by controlling the voltage levels supplied to the e-fuse circuit in sections in which the e-fuse circuit does not operate.

While the present invention has been described with respect to the specific embodiments, it will be apparent to those skilled in the art that various changes and modifications may be made without departing from the spirit and scope of the invention as defined in the following claims.

What is claimed is:

1. An integrated circuit, comprising:
    a high voltage generator configured to generate a high voltage by pumping a power source voltage;
    a negative voltage generator configured to generate a negative voltage by pumping a ground voltage;
    a divided voltage generator configured to generate a divided voltage by dividing the power source voltage and supply the divided voltage to a read voltage terminal;
    a first power gate configured to supply either the high voltage or the divided voltage to a program voltage terminal in response to an idle signal;
    a second power gate configured to supply either the negative voltage or the ground voltage to a deactivation voltage terminal in response to the idle signal;
    a third power gate configured to supply either the ground voltage or the divided voltage to an activation voltage terminal in response to the idle signal; and
    an e-fuse array circuit configured to operate using voltage supplied to the program voltage terminal as a program voltage, using voltage supplied to the divided voltage terminal as a read voltage, using voltage supplied to the activation voltage terminal as an activation voltage, and using voltage supplied to the deactivation voltage terminal as a deactivation voltage.

2. The integrated circuit of claim 1, wherein the e-fuse array circuit comprises:
    a plurality of memory cells arranged in a plurality of rows and a plurality of columns and each configured to comprise an e-fuse device and a switch device;
    a plurality of program/read lines configured to control the e-fuse devices of the plurality of memory cells;
    a plurality of row lines configured to control the switch devices of the plurality of memory cells;
    a plurality of column lines electrically connected to the e-fuse devices through the switch devices of the plurality of memory cells;
    a row circuit configured to supply the program voltage to a program/read line corresponding to a selected row when a program operation is performed, supply the read voltage to a program/read line corresponding to a selected row when a read operation is performed, supply the activation voltage to a row line corresponding to a selected row when program and read operations are performed, and supply the deactivation voltage to program/read lines and row lines corresponding to unselected rows when program and read operations are performed; and a column circuit configured to supply the deactivation voltage to a column line corresponding to a selected column when program and read operations are performed.

3. The integrated circuit of claim 2, wherein the row circuit comprises:

a row decoder configured to operate in response to the activation voltage and the deactivation voltage, supply the activation voltage to a row line corresponding to a selected row among the plurality of row lines in response to a row address and supply the deactivation voltage to remaining row lines;

a voltage supply unit configured to supply the program voltage when a program operation is performed and supply the read voltage when a read operation is performed; and a plurality of voltage converters configured to correspond to the respective row lines and each configured to supply voltage, supplied from the voltage supply unit, to each of the plurality of program/read lines when the activation voltage is supplied to each of the plurality of row lines and supply the deactivation voltage to each of the plurality of program/read lines when the deactivation voltage is supplied to each of the plurality of row lines.

4. The integrated circuit of claim 2, wherein the column circuit comprises:

a column decoder configured to select one of the plurality of columns in response to a column address; and a sense amplifier configured to supply the deactivation voltage to a column line selected by the column decoder when program and read operations are performed and to check whether there is current flowing through the selected column line or not when a read operation is performed and determine data of the selected column line based on a result of the check.

5. The integrated circuit of claim 4, wherein the column decoder grounds unselected column lines.

6. The integrated circuit of claim 1, wherein the power source voltage has a level of approximately 1 to 2V, the high voltage has a level of approximately 3.5 to 4.5V, and the negative voltage has a level of approximately −1.5 to −2.5V.

7. An integrated circuit, comprising:

a controller configured to generate a row address, a column address, a read command, a program command, and an idle signal;

a high voltage generator configured to generate a high voltage by pumping a power source voltage;

a negative voltage generator configured to generate a negative voltage by pumping a ground voltage;

a divided voltage generator configured to generate a divided voltage by dividing the power source voltage and supply the divided voltage to a read voltage terminal;

a first power gate configured to supply either the high voltage or the divided voltage to a program voltage terminal in response to an idle signal;

a second power gate configured to supply either the negative voltage or the ground voltage to a deactivation voltage terminal in response to the idle signal;

a third power gate configured to supply either the ground voltage or the divided voltage to an activation voltage terminal in response to the idle signal; and an e-fuse array circuit configured to program an e-fuse device, which is selected in response to the row address and the column address, using voltage supplied to the program voltage terminal as a program voltage in response to the program command, to read data from an e-fuse device, which is selected in response to the row address and the column address, using voltage supplied to the read voltage terminal as a read voltage in response to the read command, to use voltage supplied to the activation voltage terminal as an activation voltage, and to use voltage supplied to the deactivation voltage terminal as a deactivation voltage.

8. The integrated circuit of claim 7, wherein the e-fuse array circuit comprises:

a plurality of memory cells arranged in a plurality of rows and a plurality of columns and each configured to comprise an e-fuse device and a switch device;

a plurality of program/read lines configured to control the e-fuse devices of the plurality of memory cells;

a plurality of row lines configured to control the switch devices of the plurality of memory cells;

a plurality of column lines electrically connected to the e-fuse devices through the switch devices of the plurality of memory cells;

a row circuit configured to supply the program voltage to a program/read line corresponding to a selected row when a program operation is performed, supply the read voltage to a program/read line corresponding to a selected row when a read operation is performed, supply the activation voltage to a row line corresponding to a selected row when program and read operations are performed, and supply the deactivation voltage to program/read lines and row lines corresponding to unselected rows when program and read operations are performed; and a column circuit configured to supply the deactivation voltage to a column line corresponding to a selected column when program and read operations are performed.

9. The integrated circuit of claim 8, wherein the row circuit comprises:

a row decoder configured to operate in response to the activation voltage and the deactivation voltage, supply the activation voltage to a row line corresponding to a selected row among the plurality of row lines in response to the row address and supply the deactivation voltage to remaining row lines;

a voltage supply unit configured to supply the program voltage when the program command is activated supply the read voltage when the read command is activated; and a plurality of voltage converters configured to correspond to the respective row lines and each configured to supply voltage, which is supplied from the voltage supply unit, to each of the plurality of program/read lines when the activation voltage is supplied to each of the plurality of row lines and supply the deactivation voltage to each of the plurality of program/read lines when the deactivation voltage is supplied to each of the plurality of row lines.

10. The integrated circuit of claim 8, wherein the column circuit comprises:

a column decoder configured to select one of the plurality of columns in response to a column address; and a sense amplifier configured to supply the deactivation voltage to a column line selected by the column decoder when program and read operations are performed and to check whether there is current flowing through the selected column line or not when a read operation is performed and determine data of the selected column line based on a result of the check.

11. The integrated circuit of claim 10, wherein the column decoder grounds unselected column lines.

12. The integrated circuit of claim 7, wherein the power source voltage has a level of approximately 1 to 2V, the high voltage has a level of approximately 3.5 to 4.5V, and the negative voltage has a level of approximately −1.5 to −2.5V.

* * * * *